(12) United States Patent
Hernando

(10) Patent No.: US 9,625,549 B2
(45) Date of Patent: Apr. 18, 2017

(54) METHOD FOR ERROR COMPENSATED CHEMICAL SPECIES SIGNAL SEPARATION WITH MAGNETIC RESONANCE IMAGING

(76) Inventor: Diego Hernando, Madison, WI (US)

( * ) Notice: Subject to any disclaimer, the term of this patent is extended or adjusted under 35 U.S.C. 154(b) by 583 days.

(21) Appl. No.: 13/089,512

(22) Filed: Apr. 19, 2011

(65) Prior Publication Data

US 2012/0268120 A1 Oct. 25, 2012

(51) Int. Cl.
*G01R 33/48* (2006.01)
*G01R 33/565* (2006.01)

(52) U.S. Cl.
CPC .... *G01R 33/4828* (2013.01); *G01R 33/56518* (2013.01)

(58) Field of Classification Search
CPC .......... G01R 33/4828; G01R 33/56518; G01R 33/56536; G01R 33/565
USPC ........... 324/300–322; 600/410–413; 382/131
See application file for complete search history.

(56) References Cited

U.S. PATENT DOCUMENTS

| | | | |
|---|---|---|---|
| 6,515,476 B1 * | 2/2003 | Oshio et al. | 324/309 |
| 7,924,003 B2 | 4/2011 | Yu et al. | |
| 2005/0122105 A1 * | 6/2005 | Avram | G01R 33/4828 324/314 |
| 2005/0165296 A1 * | 7/2005 | Ma | 600/410 |
| 2007/0249929 A1 * | 10/2007 | Jeong et al. | 600/410 |
| 2009/0102481 A1 * | 4/2009 | Haacke | G01R 33/565 324/318 |
| 2010/0195885 A1 * | 8/2010 | Ma | G01R 33/4828 382/131 |
| 2010/0244822 A1 * | 9/2010 | Yu et al. | 324/307 |
| 2011/0140696 A1 * | 6/2011 | Yu | 324/309 |

OTHER PUBLICATIONS

Hernando, D., Liang, Z.-P. and Kellman, P. (2010), Chemical shift-based water/fat separation: A comparison of signal models. Magn Reson Med, 64: 811-822. doi: 10.1002/mrm.22455.*
Hernando, D., Haldar, J. P., Sutton, B. P., Ma, J., Kellman, P. and Liang, Z.-P. (2008), Joint estimation of water/fat images and field inhomogeneity map. Magn Reson Med, 59: 571-580. doi: 10.1002/mrm.21522.*
Liu CY, McKenzie CA, Yu H, Brittain JH, Reeder SB. Fat quantification with IDEAL gradient echo imaging: correction of bias from T1 and noise. Magn Reson Med 2007; 58: 354-364.*

* cited by examiner

*Primary Examiner* — Melissa Koval
*Assistant Examiner* — Rishi Patel
(74) *Attorney, Agent, or Firm* — Quarles & Brady, LLP

(57) ABSTRACT

A method for producing an image of a subject with a magnetic resonance imaging ("MRI") system, in which relative signal contributions from a plurality of different chemical species are separated, is provided. A plurality of different echo signals occurring at a respective plurality of different echo times are acquired with the MRI system and a signal model that accounts for relative signal components for each of a plurality of different chemical species is formed for each echo signal. Those echo signals containing errors, such as phase errors, magnitude errors, or errors indicative of a corrupted echo signal, are identified. The relative signal components for each of the plurality of different chemical species are then determined by fitting the echo signals with the signal model. Particularly, those echo signals identified as containing errors are fitted to the signal models in a manner that discards the error-containing information.

16 Claims, 4 Drawing Sheets

METHOD FOR ERROR COMPENSATED CHEMICAL SPECIES SIGNAL SEPARATION WITH MAGNETIC RESONANCE IMAGING

STATEMENT REGARDING FEDERALLY SPONSORED RESEARCH

This invention was made with government support under DK083380 awarded by the National Institutes of Health. The government has certain rights in the invention.

BACKGROUND OF THE INVENTION

The field of the invention is systems and methods for magnetic resonance imaging ("MRI"). More particularly, the invention relates to systems and methods for separating signal contributions from two or more chemical species using MRI.

MRI uses the nuclear magnetic resonance ("NMR") phenomenon to produce images. When a substance such as human tissue is subjected to a uniform magnetic field, such as the so-called main magnetic field, $B_0$, of an MRI system, the individual magnetic moments of the nuclei in the tissue attempt to align with this $B_0$ field, but precess about it in random order at their characteristic Larmor frequency, $\omega$. If the substance, or tissue, is subjected to a so-called excitation electromagnetic field, $B_1$, that is in the plane transverse to the $B_0$ field and that has a frequency near the Larmor frequency, the net aligned magnetic moment, referred to as longitudinal magnetization, may be rotated, or "tipped," into the transverse plane to produce a net transverse magnetic moment, referred to as transverse magnetization. A signal is emitted by the excited nuclei or "spins," after the excitation field, $B_1$, is terminated, and this signal may be received and processed to form an image.

Fat quantification using MRI has important clinical applications, including the early diagnosis and quantitative staging of non-alcoholic fatty liver disease ("NAFLD"). Compared to biopsy, which is the current gold standard for quantitative assessment of NAFLD, MRI methods have the advantages of being non-invasive and allowing volumetric coverage of the whole liver. In addition, MRI methods have the potential for reducing sampling variability, cost, and morbidity.

Chemical shift-based fat quantification methods are able to provide measurements of proton density fat fraction, which is a quantitative biomarker for NAFLD and a useful parameter for other clinical purposes. In these methods, several images are acquired with different echo time ("TE") shifts, typically using a multi-echo spoiled gradient echo ("SPGR") pulse sequence. Subsequently, separated water and fat images are reconstructed, and fat fraction maps are obtained. In order for the resulting fat fraction maps to accurately measure proton density fat fraction, multiple confounding factors in the acquired echo signals need to be addressed. These confounding factors include $B_0$ inhomogeneities, $T_1$ bias, noise bias, $T_2$ decay, spectral complexity of the fat signal, and phase errors, such as those due to eddy currents.

If not accounted for, phase errors lead to bias in fat fraction estimation in complex-based fat quantification techniques. At low fat fractions, phase errors can introduce a bias of approximately five percent, whereas measurements above 5.56 percent are typically considered abnormal. Therefore, phase errors in the acquired signals may result in clinically relevant errors for the detection and classification of NAFLD.

The presence of confounding factors may also impact the robustness and reproducibility of a biomarker, such as fat fraction. An ideal biomarker should be platform and protocol independent. For example, the estimated values of fat fraction should be independent of changes in the imaging parameters, such as spatial resolution and choice of TEs. That is to say, the estimates fat fraction values should be robust, and should not change if the measurements are made on a different platform.

To overcome the problems of phase errors, magnitude-based methods have been proposed, in which the phase of the acquired signals is discarded and, therefore, all phase errors are removed. Magnitude-based methods have been shown to produce unbiased fat fraction estimates in the presence of phase errors; however, magnitude fitting can result in severe noise amplification, particularly for certain echo time combinations. The reason for this noise amplification is that magnitude fitting discards the phase information from all the acquired echoes.

Currently, the common methods for addressing phase errors assume that the phase errors originate from eddy currents in the MRI system. In these techniques, eddy current corrections are used to compensate for the phase errors. Such methods are time consuming and have variable success. For example, the corrections are often dependent upon the particular MRI system used; thus, comparisons of fat quantification across patients scanned on different MRI systems is problematic and unreliable.

Some attempts have been made at fitting the phase values for the different echo times to a linear regression and to thereby correct those phase values that deviate from the regression by way of a multiplicative correction factor. For example, if a phase error is present at the first echo time, a constant phase value is extrapolated back from phase values at subsequent echo times. While this concept works in principle for phase errors in water signals, the technique is problematic when trying to compensate for phase errors in signal arising from fat, or other chemical species. This technique becomes problematic because signals other than water, such as fat, have more prominent phase variations; therefore, a linear regression will not appropriately extrapolate correct phase values.

It would therefore be desirable to provide a method for chemical species signal separation that addresses phase errors without discarding valuable phase information.

SUMMARY OF THE INVENTION

The present invention overcomes the aforementioned drawbacks by providing a method for separating the relative signal contributions of a plurality of different chemical species in which echo signal information containing errors is discarded during signal separation.

It is an aspect of the invention to provide a method for producing an image of a subject with a magnetic resonance imaging ("MRI") system in which relative signal contributions from a plurality of different chemical species are separated while accounting for errors, such as phase errors, magnitude errors, or errors indicative of a corrupted echo signal. A plurality of different echo signals occurring at a respective plurality of different echo times are acquired and a signal model that accounts for relative signal components for each of a plurality of different chemical species is formed for each of the plurality of different echo signals. Ones of the plurality of different echo signals that contain errors are identified, such errors including phase errors, magnitude errors, other errors indicative of a corrupted echo signal, and the like. The relative signal components for each of the plurality of different chemical species are then determined by fitting acquired the plurality of echo signals to respective ones of the formed signal models, in which the fitting discards portions of the ones of the plurality of different echo signals identified as containing errors. Using the determined signal components for at least one of the plurality of different chemical species, an image of the subject is produced.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

A method for chemical species signal separation that provides compensation for phase, magnitude, and other errors is provided. In this method, a mixed fitting method is employed to address phase errors for chemical shift-based signal separation and, in some embodiments, for fat quantification. In general, the proposed method selectively discards phase information from echo signals where phase errors are more likely to be present that others. For example, the first echo signal is often prone to accruing phase errors and, therefore, the phase information from that echo signal may be discarded. The complex values for the other echo signals are then maintained. Alternatively, the phase need not be discarded, but may be modified, such as by way of a weighting factor. By using the complex-valued data that is available and discarding or reducing the influence of phase information from data containing phase errors, the provided mixed fitting method is able to overcome systematic errors in complex fitting, while achieving superior noise performance characteristics compared to those attainable with magnitude fitting.

It should further be appreciated that, while the succeeding discussion is made primarily with reference to the separation of water and fat signals, the provided method can be readily adapted to provide accurate separation of other chemical species, such as hyperpolarized carbon-13, metabolites containing hyperpolarized carbon-13, hyperpolarized xenon-129, hyperpolarized helium-3, acetone, choline, lactate, and silicone proton NMR signals. For example, the signal from protons in water, fat, and silicone can all be separated accurately in the same imaging application by way of the provided method.

Figure 1:
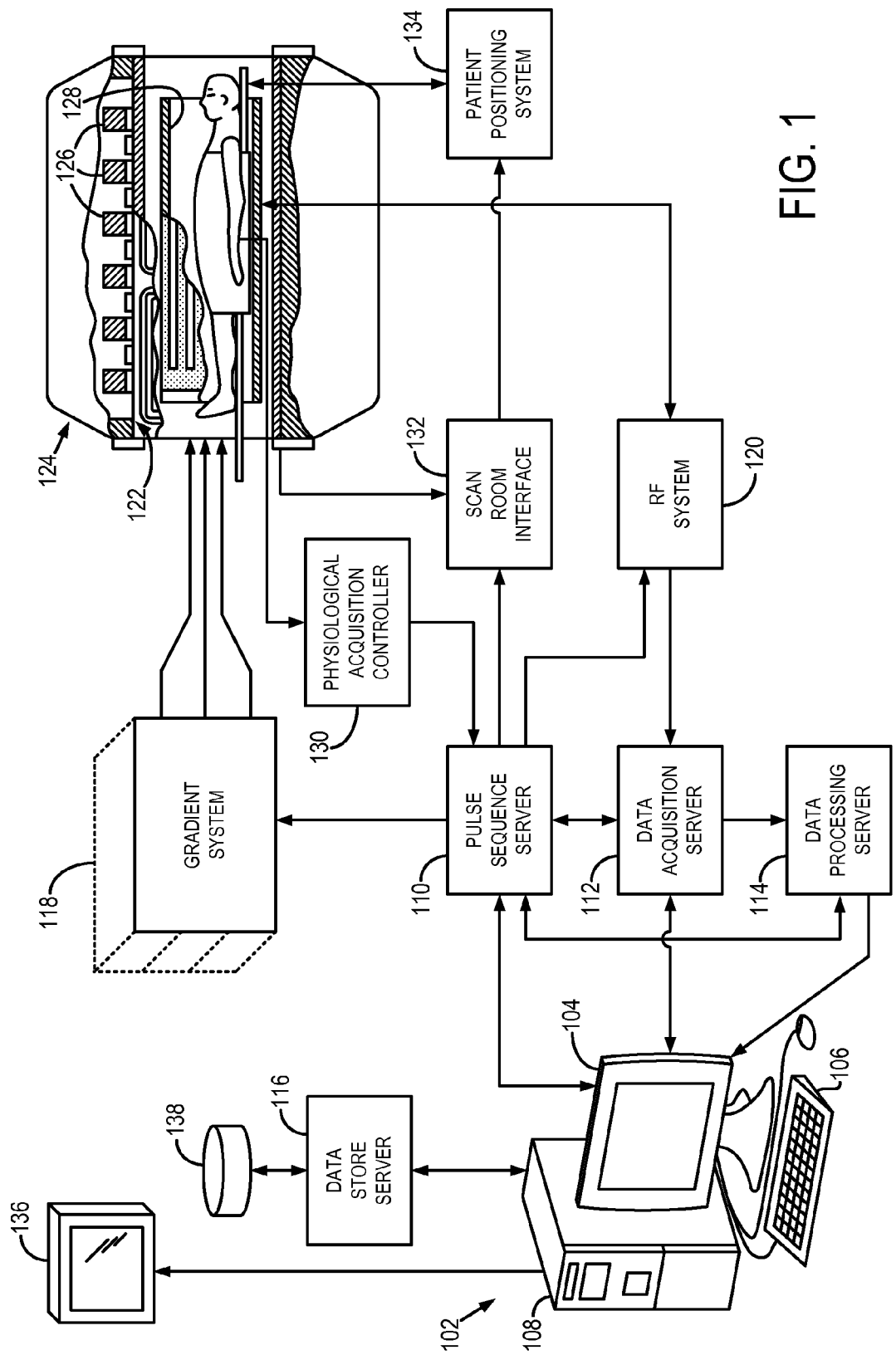
FIG. 1 is a block diagram of an exemplary magnetic resonance imaging ("MRI") system that employs the present invention.

Referring particularly now to FIG. 1, an exemplary magnetic resonance imaging ("MRI") system 100 is illustrated. The MRI system 100 includes a workstation 102 having a display 104 and a keyboard 106. The workstation 102 includes a processor 108, such as a commercially available programmable machine running a commercially available operating system. The workstation 102 provides the operator interface that enables scan prescriptions to be entered into the MRI system 100. The workstation 102 is coupled to four servers: a pulse sequence server 110; a data acquisition server 112; a data processing server 114, and a data store server 116. The workstation 102 and each server 110, 112, 114 and 116 are connected to communicate with each other.

The pulse sequence server 110 functions in response to instructions downloaded from the workstation 102 to operate a gradient system 118 and a radiofrequency ("RF") system 120. Gradient waveforms necessary to perform the prescribed scan are produced and applied to the gradient system 118, which excites gradient coils in an assembly 122 to produce the magnetic field gradients $G_x$, $G_y$, and $G_z$ used for position encoding MR signals. The gradient coil assembly 122 forms part of a magnet assembly 124 that includes a polarizing magnet 126 and a whole-body RF coil 128.

RF excitation waveforms are applied to the RF coil 128, or a separate local coil (not shown in FIG. 1), by the RF system 120 to perform the prescribed magnetic resonance pulse sequence. Responsive MR signals detected by the RF coil 128, or a separate local coil (not shown in FIG. 1), are received by the RF system 120, amplified, demodulated, filtered, and digitized under direction of commands produced by the pulse sequence server 110. The RF system 120 includes an RF transmitter for producing a wide variety of RF pulses used in MR pulse sequences. The RF transmitter is responsive to the scan prescription and direction from the pulse sequence server 110 to produce RF pulses of the desired frequency, phase, and pulse amplitude waveform. The generated RF pulses may be applied to the whole body RF coil 128 or to one or more local coils or coil arrays (not shown in FIG. 1).

The RF system 120 also includes one or more RF receiver channels. Each RF receiver channel includes an RF amplifier that amplifies the MR signal received by the coil 128 to which it is connected, and a detector that detects and digitizes the I and Q quadrature components of the received MR signal. The magnitude of the received MR signal may thus be determined at any sampled point by the square root of the sum of the squares of the I and Q components:

$$M = \sqrt{I^2 + Q^2} \qquad (1);$$

and the phase of the received MR signal may also be determined:

$$\varphi = \tan^{-1}\left(\frac{Q}{I}\right). \qquad (2)$$

The pulse sequence server 110 also optionally receives patient data from a physiological acquisition controller 130. The controller 130 receives signals from a number of different sensors connected to the patient, such as electrocardiograph ("ECG") signals from electrodes, or respiratory signals from a bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized MR signal samples produced by the RF system 120 are received by the data acquisition server 112. The data acquisition server 112 operates in response to instructions downloaded from the workstation 102 to receive the real-time MR data and provide buffer storage, such that no data is lost by data overrun. In some scans, the data acquisition server 112 does little more than pass the acquired MR data to the data processor server 114. However, in scans that require information derived from acquired MR data to control the further performance of the scan, the data acquisition server 112 is programmed to produce such information and convey it to the pulse sequence server 110. For example, during prescans, MR data is acquired and used to calibrate the pulse sequence performed by the pulse sequence server 110. Also, navigator signals may be acquired during a scan and used to adjust the operating parameters of the RF system 120 or the gradient system 118, or to control the view order in which k-space is sampled. The data acquisition server 112 may also be employed to process MR signals used to detect the arrival of contrast agent in a magnetic resonance angiography ("MRA") scan. In all these examples, the data acquisition server 112 acquires MR data and processes it in real-time to produce information that is used to control the scan.

The data processing server 114 receives MR data from the data acquisition server 112 and processes it in accordance with instructions downloaded from the workstation 102. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 114 are conveyed back to the workstation 102 where they are stored. Real-time images are stored in a data base memory cache (not shown in FIG. 1), from which they may be output to operator display 112 or a display 136 that is located near the magnet assembly 124 for use by attending physicians. Batch mode images or selected real time images are stored in a host database on disc storage 138. When such images have been reconstructed and transferred to storage, the data processing server 114 notifies the data store server 116 on the workstation 102. The workstation 102 may be used by an operator to archive the images, produce films, or send the images via a network to other facilities.

Figure 2:
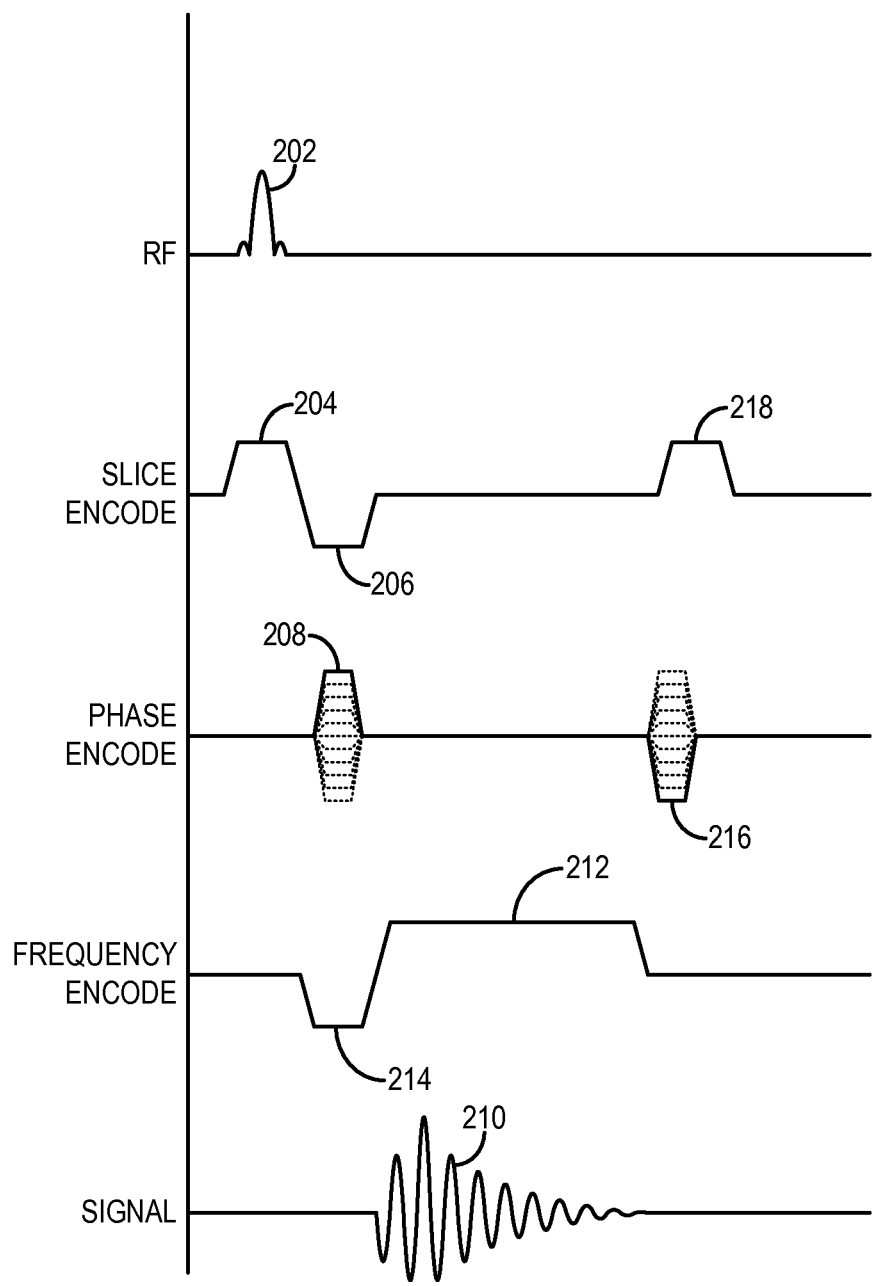
FIG. 2 is a graphic representation of an exemplary spoiled gradient recalled echo ("SPGR") pulse sequence for directing the MRI system of FIG. 1 to acquire image data in accordance with embodiments of the present invention.

An exemplary pulse sequence employed to direct the MRI system to acquire image data in accordance with embodiments the present invention is illustrated in FIG. 2. Such an exemplary pulse sequence is commonly referred to as a spoiled gradient recalled echo ("SPGR") pulse sequence. It will be appreciated, however, that a variety of different pulse sequences can be employed, including fast spin echo ("FSE") sequences, gradient-recalled echo ("GRE") sequences, steady-state free precession ("SSFP") sequences, echo-planar imaging ("EPI") sequences, spiral imaging sequences, and radial imaging sequences.

The exemplary SPGR pulse sequence includes a spatially selective radio frequency ("RF") excitation pulse 202 that is repeated at the start of each repetition time ("TR") period. Moreover, the RF excitation pulse 202 is played out in the presence of a slice-selective gradient 204 in order to produce transverse magnetization in a prescribed imaging slice. The slice-selective gradient 204 includes a rephasing lobe 206 that acts to rephase unwanted phase accruals caused by the RF excitation pulse 202. Following excitation of the nuclear spins in the prescribed imaging slice, a phase encoding gradient 208 is applied to spatially encode a nuclear magnetic resonance signal, representative of a gradient-recalled echo 210, along one direction in the prescribed imaging slice. A readout gradient 212 is also applied after a dephasing gradient lobe 214 to spatially encode the signal representative of echo 210 along a second, orthogonal direction in the prescribed imaging slice. The signal representative of echo 210 is sampled during a data acquisition window.

A rewinder gradient 216 is played out along the phase-select gradient axis in order to rephase remaining transverse magnetization in preparation for subsequent repetitions of the pulse sequence. As is well known in the art, the pulse sequence is repeated and the amplitude of the phase-encoding gradient 206 and the rewinder gradient 216, which is equal in amplitude and area, but opposite in polarity with respect to the phase-encoding gradient 206, are stepped through a set of values such that k-space is sampled in a prescribed manner. The pulse sequence concludes with the application of a spoiler gradient 218 that spoils the remaining transverse magnetization.

As will be explained in more detail below, image data is acquired a plurality of times from each prescribed imaging slice, and the echo time ("TE") is incremented during successive repetitions such that N sets of image data corresponding to N different echo times are acquired for each prescribed imaging slice. Alternatively, the N sets of image data can be acquired at N different echo times within the same TR period. Furthermore, the N sets of image data can be acquired at multiple TRs, each collecting a subset of image data. By way of example, the successive echo times are incremented by 1.6 milliseconds during each successive repetition of the pulse sequence. It is noted that any number of multiple echoes can be acquired when practicing the present invention, including only two echoes, in which so-called "2-point Dixon methods" can be employed. In general the more echoes that are acquired, the more reliable the method will be. For example, as the number of echoes acquired is increased, the spectral differences between species becomes more "observable." Additional echoes may be acquired with low spatial resolution in order to minimize additional scan time requirements.

The pulse sequence employed to direct the MRI system to acquire data can be adapted to include magnetization preparation pulses in order to manipulate the spectra of the species being images. For example, non-selective or spectrally selective magnetization preparation pulses can be utilized, such as inversion recovery pulses, $T_2$-prep pulses, fat-sat pulses, and magnetization transfer pulses. SSFP pulse sequences can also be implemented to alter the characteristics of specific spectral peaks. In this manner, a particular spectrum can be made more "unique" and easier to separate. For example, if different peaks of fat are placed in different spectral pass bands of an SSFP-based acquisition, the change in phase between pass bands will alter the sign, positive or negative, of specific spectral peaks. This behavior can be exploited to improve the robustness of the separation. Other preparation methods include $T_2$-prep methods; magnetization transfer methods; methods that facilitate J-coupling; methods that exploit differences in $T_1$ or $T_2$ between species, or between peaks within a specific species; velocity encoding; and any such methods that change the appearance of the spectrum of a particular species.

The signal model for a combined water-fat signal for N echoes acquired at echo times, $t_n$, in which multiple spectral peaks are accounted for in the fat signal, may be expressed as:

$$s_n = \left(\rho_W + \rho_F \sum_{m=1}^{M} \alpha_m e^{i2\pi f_m t_n}\right) e^{-R_2^* t_n} e^{i2\pi f_B t_n}; \quad (3)$$

where $\rho_W$ and $\rho_F$ are the water and fat signal amplitudes, respectively; $f_m$ is the $m^{th}$ frequency value for the M spectral peaks in the fat signal model; $\alpha_m$ is the $m^{th}$ relative spectral peak amplitude value for the M spectral peaks in the fat signal model; $t_n$ is the echo time for the $n^{th}$ acquired echo signal, with $n=1, \ldots, N$; $R_2^*$ is the transverse relaxation rate as affected by magnetic field inhomogeneities, which is equal to $R_2^* = 1/T_2^*$; and $f_B$ is the local frequency offset due to $B_0$ field inhomogeneities. The spectral frequencies, $f_m$, of the fat signal are known, as are the relative peak amplitudes, $\alpha_m$, for those spectral peaks. If the relative peak amplitudes, $\alpha_m$, are not know, they can be determined using an auto-calibration technique, such as the one described in U.S. Pat. No. 7,924,003, which is herein incorporated by reference in its entirety. The relative peak amplitudes, $\alpha_m$, are subject to the following relationship:

$$\sum_{m=1}^{M} |\alpha_m| = 1. \quad (4)$$

Figure 3A:
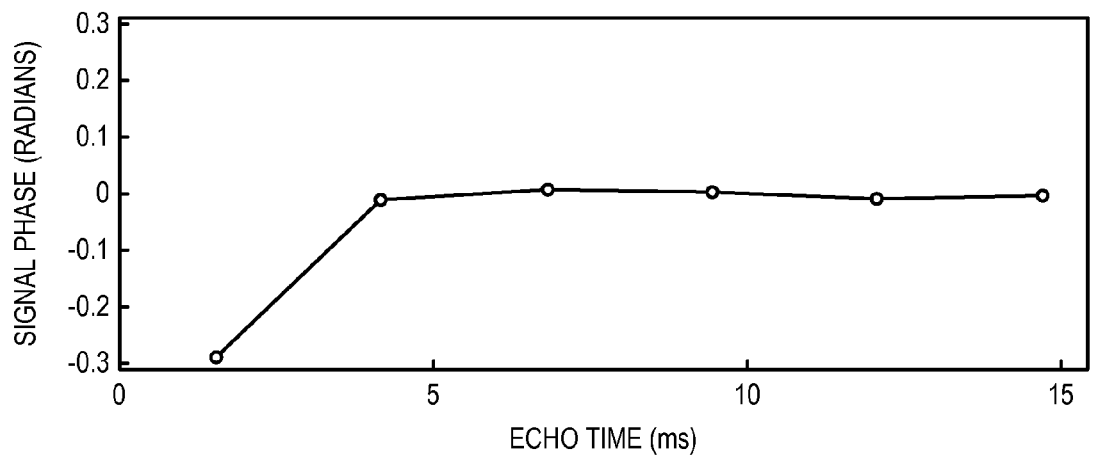
FIG. 3A is an exemplary plot of phase values for each a six different echoes acquired at six respectively different echo times, in which phase errors are present in a first echo.

The model in Eqn. (3) makes the assumption that the transverse relaxation rate, $R_2^*$, for water and all of the fat peaks are equal. This approximation introduces low bias and improved noise stability. In the presence of phase errors, the signal model presented in Eqn. (3) is modified as follows:

$$s_{n,acq} = s_n e^{i\phi_n} + \eta_n \quad (5);$$

where $\phi_n$ is the phase error in the $n^{th}$ echo signal and $\eta_n$ is complex Gaussian noise. It is contemplated that for single-shot acquisitions the majority of phase errors will occur primarily in the first echo; that is, $\phi_n = 0$ for $n \geq 2$. This assumption is illustrated in FIG. 3A. Using this assumption, a mixed magnitude-complex fitting method can be utilized when separating the relative signal contributions of different chemical species. For example, to determine the relative signal contributions for water and fat using the signal models in Eqns. (3) and (5), the following minimization may be performed:

$$\min_{\rho_W, \rho_F, R_2^*, f_B} \left\{(|s_1| - |s_{1,acq}|)^2 + \sum_{n=2}^{N} |s_n - s_{n,acq}|^2\right\}; \quad (6)$$

where the first term in the minimization is related to a nonlinear least-squares problem that seeks the estimates of the variables $\{\rho_W, \rho_F, R_2^*, f_B\}$ that best fit the magnitude of the signal from the first echo, in the least-squares sense; and the second term in the minimization is related to a nonlinear least-squares problem that seeks the estimates of the variables $\{\rho_W, \rho_F, R_2^*, f_B\}$ that best fit the complex-valued signal from the remaining echoes, in the least-squares sense. This approach combines magnitude fitting for the first term, $(|s_1| - |s_{1,acq}|)^2$, and complex fitting for the second term, $$\sum_{n=2}^{N} |s_n - s_{n,acq}|^2,$$

which thereby removes the influence of phase errors from the first echo in the resultant water and fat images. A fat fraction can then be calculated from these water and fat images, in which phase errors are significantly reduced.

Figure 3B:
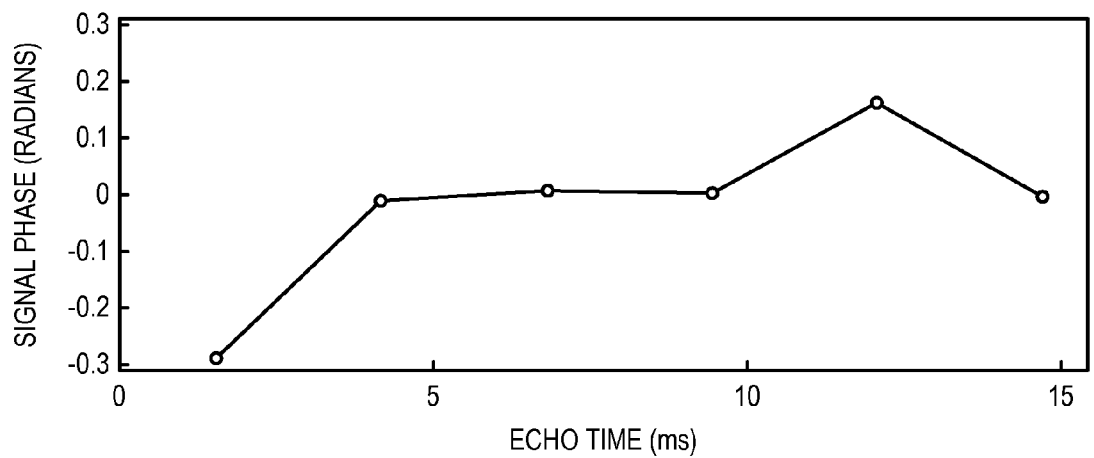
FIG. 3B is another exemplary plot of phase values for each a six different echoes acquired at six respectively different echo times, in which phase errors are present in a first and fifth echo.

The minimization in Eqn. (6) can be generalized to address phase errors that may occur at other echoes than the first echo. As illustrated in FIG. 3B, there may be instances where significant phase errors occur at various echoes. In these instances, the following generalized minimization may be used:

$$\min_{\rho_W, \rho_F, R_2^*, f_B} \left\{\sum_u (|s_u| - |s_{u,acq}|)^2 + \sum_v |s_v - s_{v,acq}|^2\right\}; \quad (7)$$

where the index, u, counts the echo times at which a phase error is recorded and the index, v, counts the echo times at which no phase errors are recorded. For example, if a phase error is recorded at a first and fifth echo time in a data set that includes data sampled at six different echo times, as illustrated in FIG. 3B, then $u = \{1,5\}$ and $v = \{2,3,4,6\}$.

It should be noted that the aforementioned mixed fitting minimization can also be adapted to fit phase values of selected echoes and to remove other echoes altogether. For instance, if the MRI system encounters an error in which a particular echo becomes corrupted, that echo may be removed altogether. There may be other instances where the phase of an echo is substantially free of errors, but the magnitude may be corrupted or contain errors. For example, where there is severe through-slice $B_0$ field inhomogeneities, dephasing and significant additional signal decay may be present in later acquired echoes. Such a generalized minimization takes the following form:

$$\min_{\rho_W, \rho_F, R_2^*, f_B} \left\{ \begin{array}{l} \sum_q 0 \cdot s_q + \sum_r w_r \cdot (\angle(s_r) - \angle(s_{r,acq}))^2 + \\ \sum_u (|s_u| - |s_{u,acq}|)^2 + \sum_v |s_v - s_{v,acq}|^2 \end{array} \right\}; \quad (8)$$

where the index, q, counts those echo times that are to be discarded in their entirety; the index, r, counts those echo times at which a magnitude error is recorded; $\angle(\cdots)$ is an angle operator, which returns the phase, or angle, value of a complex number; and $w_r$ is a weighting factor that accounts for scaling of the phase values. For example the phase values returned by the angle operator will be in the range of $0$-$2\pi$, whereas the third and fourth terms in Eqn. (8) may be much smaller, such as on the order of $1 \times 10^{-6}$ or $1 \times 10^6$. Thus, the weighting factor, $w_r$, can be selected to ensure that the second term and the third and fourth terms remain in a relative balance so that one does not overwhelm the other.

The foregoing minimization problems may be readily modified where the assumption that the $R^*_2$ value for the chemical species are equal does not hold. For example, if the $R^*_2$ value for water and fat are not equal the following signal model can be used to replace the one provided in Eqn. (3):

$$s_n = \left(\rho_W e^{-R^*_{2,W} t_n} + \rho_F \sum_{m=1}^{M} \alpha_m e^{i2\pi f_m t_n} e^{-R^*_{2,F} t_n}\right) e^{i2\pi f_B t_n}; \quad (9)$$

where $R^*_{2,W}$ is the $R^*_2$ value for water, and $R^*_{2,F}$ is the $R^*_2$ for fat. In general, the signal model of Eqn. (3) can be generalized to account for any number of different chemical species as follows:

$$s_n = \left(\sum_Q \left(\rho_Q \sum_{m,Q=1}^{M_Q} \alpha_{m,Q} e^{i2\pi f_{m,Q} t_n} e^{-R^*_{2,Q} t_n}\right)\right) e^{i2\pi f_B t_n}; \quad (10)$$

where the index, Q, indicates a given chemical species and, therefore, $\rho_Q$ is the relative signal contribution for that chemical species, $R^*_{2,Q}$ is the $R^*_2$ value for that chemical species, and the index, m, counts the number of spectral peaks, $M_Q$, associated with the chemical species. For example, Q may indicate one of water, fat, hyperpolarized carbon-13, metabolites containing hyperpolarized carbon-13, hyperpolarized xenon-129, hyperpolarized helium-3, acetone, choline, lactate, and silicone. By way of example, Q may indicate water, fat, and silicone, in which case Eqn. (10) may be expressed as:

$$s_n = \left(\rho_W e^{-R^*_{2,W} t_n} + \rho_F \sum_{m,F=1}^{M_F} \alpha_{m,F} e^{i2\pi f_{m,F} t_n} e^{-R^*_{2,F} t_n} + \rho_S \sum_{m,S=1}^{M_S} \alpha_{m,S} e^{i2\pi f_{m,S} t_n} e^{-R^*_{2,S} t_n}\right) e^{i2\pi f_B t_n}; \quad (11)$$

where $\rho_S$ is the silicone signal amplitude; $\alpha_{m,S}$ is the relative spectral peak amplitude for the $m^{th}$ spectral peak in the silicone spectrum; $f_{m,S}$ is the resonance frequency value for the $m^{th}$ spectral peak in the silicone spectrum; and $R^*_{2,S}$ is the $R^*_2$ value for silicone.

Figure 4:
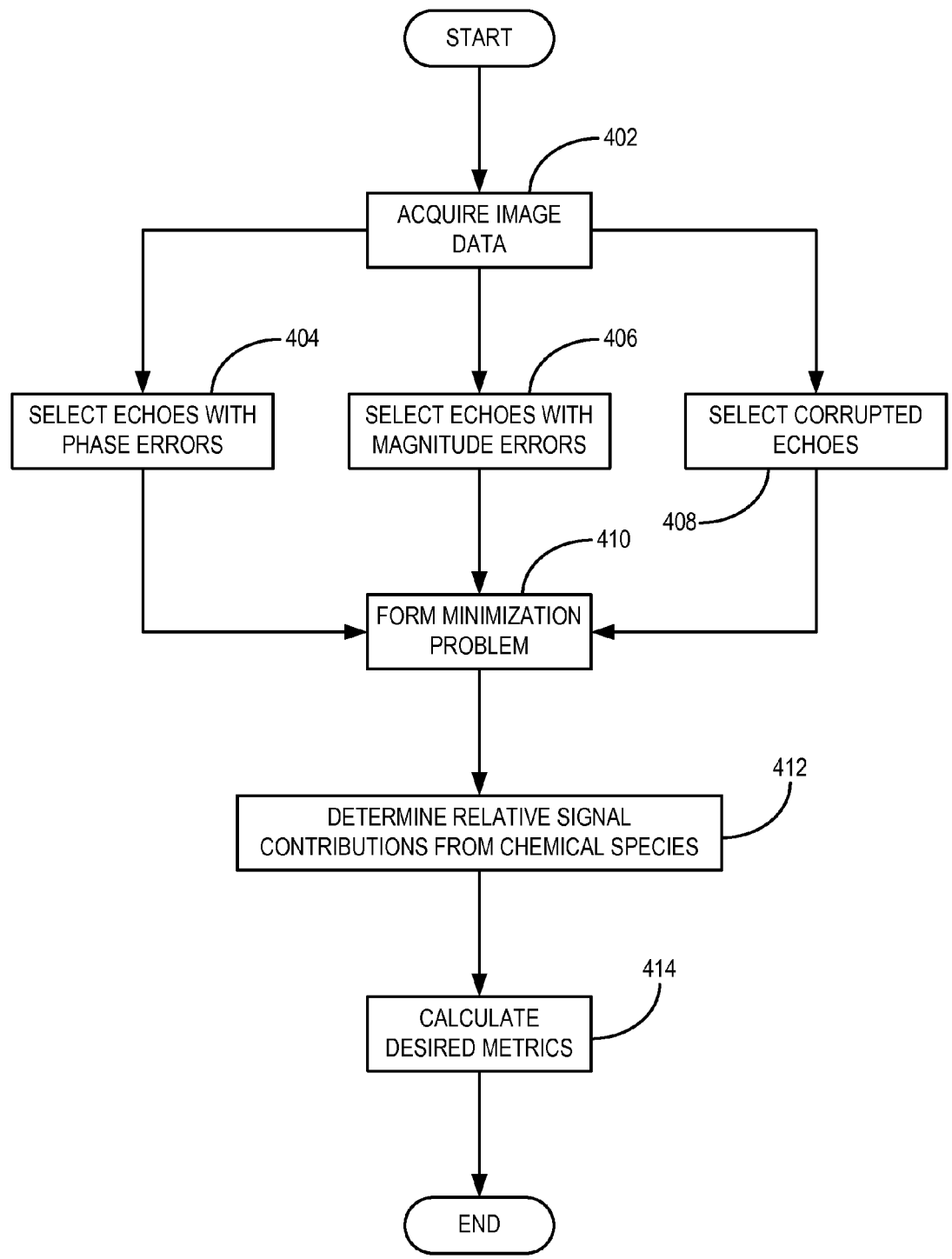
FIG. 4 is a flowchart setting forth the steps of an exemplary method for separating the relative signal contributions of different chemical species using a mixed fitting method.

Referring now to FIG. 4, a flowchart setting forth the steps of an exemplary method for separating the relative signal contributions of different chemical species using a mixed fitting method is provided. The method begins with the acquisition of image data, as indicated at step 402. Image data may be acquired with the pulse sequence illustrated in FIG. 2, or by any number of other suitable pulse sequences. Generally, image data is acquired from echo signals formed at a number of different echo times. For example, three or more different echoes may be formed at three or more respectively different echo times. After data acquisition has been acquired, the image data is analyzed for errors. As indicated at step 404, those echoes that were acquired with phase errors are selected for different treatment that the other echoes. Similarly, as indicated at steps 406 and 408, those echoes that were acquired with magnitude errors or that are corrupted altogether may be selected for different treatment as well.

A minimization problem is then formed using the acquired image data and the information pertaining to which echoes contain unwanted errors, as indicated at step 410. Exemplary minimization problems are those presented in Eqns. (6)-(8) above. The appropriate minimization problem is selected based on whether phase errors, magnitude errors, or corrupt echoes are identified for treatment. Additionally, the minimization problem is formed using an appropriate signal model, such as those presented in Eqns. (3), (5), and (9)-(11). Generally, the signal model is selected based on the types and number of chemical species whose relative signal contributions it is desired to separate; however, the signal model may also be selected based on assumptions related to the $R^*_2$ values for the chemical species, as well.

After the appropriate minimization problem has been formed, the minimization is performed in order to determine the relative signal contributions from the chemical species identified in the selected signal model, as indicated at step 412. When desired, further metrics can be calculated from the determined relative signal contributions, as indicated at step 414. For example, when the desired chemical species are water and fat, the separated water and fat signals can be used to calculate a fat fraction according to:

$$100 - 100 \cdot \frac{|\rho_F|}{|\rho_W + \rho_F|}; \quad (12)$$

however, it should be appreciated that the fat fraction can be calculated in other ways, as well.

When the provided method is utilized to calculate fat fraction, a robust quantitative biomarker can be provided because the fat fraction is significantly free from errors that would be introduced from, for example, the phase errors present in some of the echo signals. It will be appreciated that performing the minimization formed in step 410 can also result in other metrics, such as $R^*_2$ values for the chemical species.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for producing an image of a subject with a magnetic resonance imaging (MRI) system, the steps of the method comprising:
  a) acquiring with the MRI system, a plurality of different echo signals occurring at a respective plurality of different echo times;
  b) forming for each of the plurality of different echo signals, a signal model that accounts for relative signal components for each of a plurality of different chemical species;
  c) selecting ones of the plurality of different echo signals that contain errors by identifying corrupted information in the plurality of different echo signals that contain errors associated with one of corrupted magnitude information or corrupted phase information in the plurality of different echo signals, wherein the selected ones of the plurality of different echo signals is less than the plurality of different echo signals acquired in step a);
  d) determining the relative signal components for each of the plurality of different chemical species by fitting the plurality of echo signals acquired in step a) to respective ones of the signal models formed in step b), in which the fitting also discards or weights with a weighting factor having a value between zero and less than one, only the corrupted information in the selected ones of the plurality of different echo signals identified in step c) as containing errors associated with one of corrupted magnitude information or corrupted phase information; and e) producing an image of the subject using the relative signal components for one of the plurality of different chemical species determined in step d).

2. The method as recited in claim 1 in which the plurality of different chemical species includes at least two of water, fat, silicone, hyperpolarized carbon-13, metabolites containing hyperpolarized carbon-13, hyperpolarized xenon-129, hyperpolarized helium-3, acetone, choline, and lactate.

3. The method as recited in claim 1 in which the plurality of different chemical species comprises water and fat, and in which the signal models formed in step b) account for a fat spectrum having multiple spectral peaks.

4. The method as recited in claim 3 in which the signal models formed in step b) equate a transverse relaxation rate of water with a transverse relaxation rate for fat.

5. The method as recited in claim 1 in which the plurality of different echo signals are acquired in step a) by directing the MRI system to perform a single-shot acquisition pulse sequence.

6. The method as recited in claim 1 in which the plurality of different echo signals are acquired in step a) by directing the MRI system to perform a multiple-shot acquisition pulse sequence.

7. The method as recited in claim 1 in which step d) includes fitting only a magnitude of the ones of the plurality of different echo signals selected in step c) as containing errors associated with corrupted phase information to a magnitude of the respective signal model formed in step b).

8. The method as recited in claim 1 in which step d) includes fitting only a phase of the ones of the plurality of different echo signals selected in step c) as containing errors associated with corrupted magnitude information to a phase of the respective signal model formed in step b).

9. The method as recited in claim 1 further comprising:
f) producing a metric using the relative signal components for ones of the plurality of different chemical species determined in step d).

10. The method as recited in claim 9 in which the plurality of different chemical species comprises water and fat, and in which the metric calculated in step f) is a fat fraction.

11. A method for separating relative signal components from a plurality of different chemical species in a subject with a magnetic resonance imaging (MRI) system, the steps of the method comprising:
a) acquiring with the MRI system, a plurality of image data sets by sampling echo signals occurring at each of a respective plurality of different echo times;
b) forming a system of equations that relates the plurality of image data sets acquired in step a) to a relative signal component for each of the plurality of different chemical species;
c) selecting ones of the plurality of image data sets that contain phase errors; and
d) calculating a relative signal component for each of the plurality of different chemical species by solving the system of equations formed in step b) using a minimization in which phase information from the ones of the plurality of image data sets selected in step c) is discarded.

12. The method as recited in claim 11 in which the plurality of different chemical species includes at least two of water, fat, silicone, hyperpolarized carbon-13, metabolites containing hyperpolarized carbon-13, hyperpolarized xenon-129, hyperpolarized helium-3, acetone, choline, and lactate.

13. The method as recited in claim 11 in which the plurality of different chemical species comprises water and fat, and in which the system of equations formed in step b) is a system of linear equations that accounts for a fat spectrum having multiple spectral peaks.

14. The method as recited in claim 13 in which the system of linear equations formed in step b) equates a transverse relaxation rate of water with a transverse relaxation rate of fat.

15. The method as recited in claim 11 in which the plurality of image data sets are acquired in step a) by directing the MRI system to perform a single-shot pulse sequence.

16. The method as recited in claim 15 in which phase information from one of the plurality of image data sets corresponding to a first echo signal acquired at a first echo time is discarded in step c).

* * * * *